(12) United States Patent
Trivedi et al.

(10) Patent No.: US 6,410,984 B1
(45) Date of Patent: *Jun. 25, 2002

(54) CONDUCTIVE STRUCTURE IN AN INTEGRATED CIRCUIT

(75) Inventors: Jigish D. Trivedi; Ravi Iyer, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/436,338

(22) Filed: Nov. 8, 1999

Related U.S. Application Data

(60) Continuation of application No. 09/027,537, filed on Feb. 23, 1998, now Pat. No. 2,981,380, which is a division of application No. 08/916,356, filed on Aug. 22, 1997, now Pat. No. 5,847,463.

(51) Int. Cl.[7] .................... H01L 23/48; H01L 23/52; H01L 29/40
(52) U.S. Cl. .................... 257/751; 257/763; 257/764
(58) Field of Search ................ 257/751, 763, 257/764, 767, 382

(56) References Cited

U.S. PATENT DOCUMENTS

| | | | |
|---|---|---|---|
| 4,470,189 A | 9/1984 | Roberts et al. | 29/571 |
| 4,884,123 A | 11/1989 | Dixit et al. | 357/71 |
| 5,066,615 A | 11/1991 | Brady et al. | 438/229 |
| 5,292,681 A | 3/1994 | Lee et al. | 438/48 |
| 5,365,111 A | 11/1994 | Ramaswami et al. | 257/767 |
| 5,371,041 A | 12/1994 | Liou et al. | 438/192 |
| 5,444,018 A | 8/1995 | Yost et al. | 437/190 |
| 5,510,292 A | 4/1996 | Hayashi | 438/187 |
| 5,518,960 A | 5/1996 | Tsuchimoto | 437/193 |

(List continued on next page.)

Primary Examiner—Phat X. Cao
(74) Attorney, Agent, or Firm—Workman, Nydegger & Seeley

(57) ABSTRACT

A method of forming a local interconnect structure is provided. A first barrier layer comprising sputtered titanium nitride is formed over a topographical structure situated upon a field oxide region within a semiconductor substrate. A hard mask layer comprising tungsten silicide is formed over the first barrier layer. A photoresist layer is then formed over the hard mask layer. The hard mask layer is selectively removed from above an adjacent gate stack on the semiconductor substrate using an etch that is selective to the first barrier layer. The first barrier layer is selectively removed using an etch that is selective to the hard mask layer. A silica layer is formed over the hard mask layer. A recess is formed in the silica layer that is aligned with an active area within the semiconductor substrate. The recess is filled with an electrically conductive material. A second method of forming a local interconnect structure is provided comprising forming a first barrier layer comprising sputter titanium nitride over a semiconductor substrate having a topographical structure situated upon a field oxide region within the semiconductor substrate. A first electrically conductive layer comprising tungsten is then formed over the first barrier layer using chemical vapor deposition. The first electrically conductive layer provides good step coverage over the topographical structure. A second barrier layer comprising sputtered titanium nitride is formed over the first electrically conductive layer. A hard mask layer comprising polysilicon or silica is then formed over the second barrier laster. The hard mask is selectively removed from above an adjacent gate stack on the semiconductor substrate with an etch that is selective to the second barrier layer. The second barrier layer, the first conductive layer, and the first barrier layer are selectively removed, thereby exposing the underlying gate stack on the semiconductor substrate using a chemical etch selective to the hard mask layer. A silica layer is then formed with a recess therein that is filled with an electrically conductive material to form an active area contact through the local interconnect structure.

21 Claims, 5 Drawing Sheets

U.S. PATENT DOCUMENTS

| | | | |
|---|---|---|---|
| 5,654,589 A | 8/1997 | Huang et al. | 257/770 |
| 5,665,641 A | 9/1997 | Shen et al. | 438/643 |
| 5,686,761 A | 11/1997 | Huang et al. | 257/763 |
| 5,696,017 A | 12/1997 | Ueno | 438/60 |
| 5,707,883 A | 1/1998 | Tabara | 438/40 |
| 5,718,800 A | 2/1998 | Juengling | 156/643 |
| 5,759,901 A | 6/1998 | Loh et al. | 438/305 |
| 5,776,822 A | 7/1998 | Fujii et a. | 438/586 |
| 5,786,275 A | 7/1998 | Kubo | 438/692 |
| 5,804,479 A | 9/1998 | Aoki et al. | 438/53 |
| 5,847,463 A * | 12/1998 | Trivedi et al. | 257/751 |

* cited by examiner

CONDUCTIVE STRUCTURE IN AN INTEGRATED CIRCUIT

RELATED APPLICATIONS

This is a continuation patent application of U.S. patent application Ser. No. 09/027,537, filed on Feb. 23, 1998, now U.S. Pat. No. 5,981,380, titled Method of Making A Local Interconnect, now U.S. Pat. No. 5,981,380, which is a divisional patent application of U.S. patent application Ser. No. 08/916,356, filed on Aug. 22, 1997, titled Local Interconnect and Method of Formation, now U.S. Pat. No. 5,847,463, both of which are incorporated herein by reference.

BACKGROUND OF THE INVENTION

1. The Field of the Invention

The present invention relates to a local interconnect in an integrated circuit, and particularly to a method of making a local interconnect structure situated on an active area within a semiconductor substrate, where the lo,al interconnect has tungsten silicide and titanium nitride layers, or has a tungsten layer covered on opposite sides thereof with titanium nitride.

2. The Relevant Technology

Local interconnects are normally used when a metalization is not being used to electrically connect semiconductor devices. A lo, al interconnect is used, for example, to put a conductive material in electrical contact with an active area in a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

Typical local interconnects comprise materials such as titanium nitride, titanium silicide and other kinds of low resistance materials such as refractory metal suicides. Typically, after the gates and transistors and other topographical structures are defined, a refractory metal film is formed thereover either by sputtering, also known as physical vapor deposition process, or by chemical vapor deposition (CVD). Sputtering titanium nitride film is characterized by low resistivity with poor step coverage. As a result, sputtered titanium nitride film is difficult to use in circuits and devices with vertically oriented topographies. Sputtering produces a titanium nitride film with a lower resistivity than CVD titanium nitride, but has a poorer step coverage over vertically oriented topographies.

In situations where a hard mask is needed in the formation of an interconnect structure, hard masks have typically been comprised of polysilicon or silica. In a contact etch, the hard mask need not be removed if the contact etch can etch through the hard mask and stop etching on an underlying local interconnect without compromising active areas. If the contact etch can not etch through the hard mask without deleterious effect, then the hard mask should be removed during fabrication of the interconnect structure, and such removal can be difficult to properly achieve.

Another problem with a polysilicon or oxide hard mask is that typical etches are not selective to these types of hard masks, and where the hard mask is not a conductive material, it tends to oxidize. If the etch etches through the hard mask and underlying layer(s) of a local interconnect, the etch can potentially damage the active area. If so, removal of the hard mask is desirable. One removal method for polysilicon or silica hard mask is a wet etching process. The etching process, however, is not desirably selective to polysilicon or to silica. This results in difficulty in controlling the etch, which difficulty can result in a low yield rate due to an over etching into an underlying active area in the semiconductor substrate.

Typically, refractory material nitrides are used as a barrier layer. For example, the nitrides include titanium nitride and tungsten nitride. It is difficult to stop an etch on a nitride. If the etch is too deep and goes through beyond the nitride, the active area can be compromised. Titanium nitride, as such, is not a preferred material for a dry etching process for a selective etch. To compensate, a type of material is put down that can be patterned, such as a photoresist layer through which the titanium nitride can be selectively removed without a hard mask. It is difficult, however, to control the etch of the titanium nitride without any kind of hard mask, and such difficulty of control may result in an etch through the titanium nitride layer and into the underlying active area.

It may be desirable to use two etchants, such as one to etch a first interconnect material and another to etch the titanium nitride in contact therewith. For example, it titanium nitride and titanium silicide are the layers; of the interconnect structure, the titanium silicide can be etched with an hydrofluoric chemistry etch, but the etch will not substantially etch the titanium nitride. Consequently, a second etch is needed that will etch the titanium nitride, where the second etch is selective to titanium silicide.

It would be advantageous to overcome the problems of poor step coverage and uncontrolled etching, and to be able to use one etchant to remove both the interconnect material and an associated barrier layer. In addition, it would be advantageous to utilize a material which also provides an improved step coverage in the fabrication of the interconnect structure.

SUMMARY OF THE INVENTION

Additional advantages of the invention will be set forth in the description which follows, and in part will be obvious from the description, or may be learned by the practice of the invention. The advantages of the invention may be realized and obtained by means of the instruments and combinations particularly pointed out in the appended claims.

In accordance with the invention as embodied and broadly described herein, a method of forming a local interconnect structure is provided. A first barrier layer comprising sputtered titanium nitride is formed over a semiconductor substrate having a topographical structure situated upon a field oxide region within the semiconductor substrate. The semiconductor substrate comprises a silicon base layer that includes active areas therein and has gate stacks thereon.

A hard mask layer is then formed over the first barrier layer and multilayer structures using chemical vapor deposition. The hard mask layer comprises CVD tungsten silicide and provides good step coverage. The first barrier layer also provides adhesion of tungsten silicide to the semiconductor substrate and to the field oxide region. A photoresist layer is then formed over the hard mask layer. The hard mask is selectively removed from above an adjacent multilayer structure using a chemical etch that is selective to the first barrier layer so as to expose the first barrier layer. The first barrier layer is then selectively removed from a surface of the adjacent multilayer structure using) a chemical etch that is selective to the tungsten silicide of the hard mask layer. A passivation layer, composed of silica for example, is formed over the hard mask layer. A recess is formed in the passivation layer that is generally aligned with an active area in the semiconductor substrate adjacent to the adjacent multilayer structure. The recess is substantially filled with an electrically conductive material. A planarizing operation is conducted to isolate other electrically conductive material within other recesses one from another.

A second method of forming a local interconnect structure is also provided. The second method comprises forming a first barrier layer comprising sputtered titanium nitride over a semiconductor substrate having topographical structure. The semiconductor substrate comprises a silicon base layer that includes active areas therein and has gate stack thereon. A first electrically conductive layer that comprises CVD tungsten is then formed over the first barrier layer. The first electrically conductive layer provides good step coverage. A second barrier layer comprising sputtered titanium nitride is formed over the first electrically conductive layer.

A hard mask layer is then formed over the second barrier layer. The hard mask is composed of a material such as polysilicon, silicon dioxide, or tungsten silicide. The hard mask is selectively removed above an adjacent multilayer structure using a chemical etch selective to the second titanium nitride barrier layer. The second barrier layer, the first conductive layer, and said first barrier layer are ,electively removed using a chemical etch comprising an ammonium peroxide mixture selective to the hard mask layer. The ammonium peroxide mixture comprises ammonia, peroxide and water in a ratio of 1:1:5 by volume and is used at a temperature of about 65° C. A silica layer substantially is then formed over the semiconductor substrate. A recess is formed in the silica layer that is generally aligned with an active area within the semiconductor substrate. The recess is substantially filled with a second electrically conductive layer thereby forming a contact through at least the second barrier layer, the first conductive layer, and the first barrier layer to the active area in the semiconductor substrate. A planarizing operation is conducted to isolate other second electrically conductive layers within other recesses one from another.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not, therefore, to be considered as limiting of its scope, the invention will be described and explained with additional specificity and detail through the use of the accompanying drawings in which.

DETAILED DESCRIPTION OF THE PREFERRED EMBODIMENTS

The inventive process forms an interconnect structure from titanium nitride (TiN) with tungsten silicide, or from a tungsten layer covered on opposite sides thereof by titanium nitride. One application of the inventive process is used with a gate stack and a contact to an adjacent active area in a semiconductor substrate.

Figure 1:
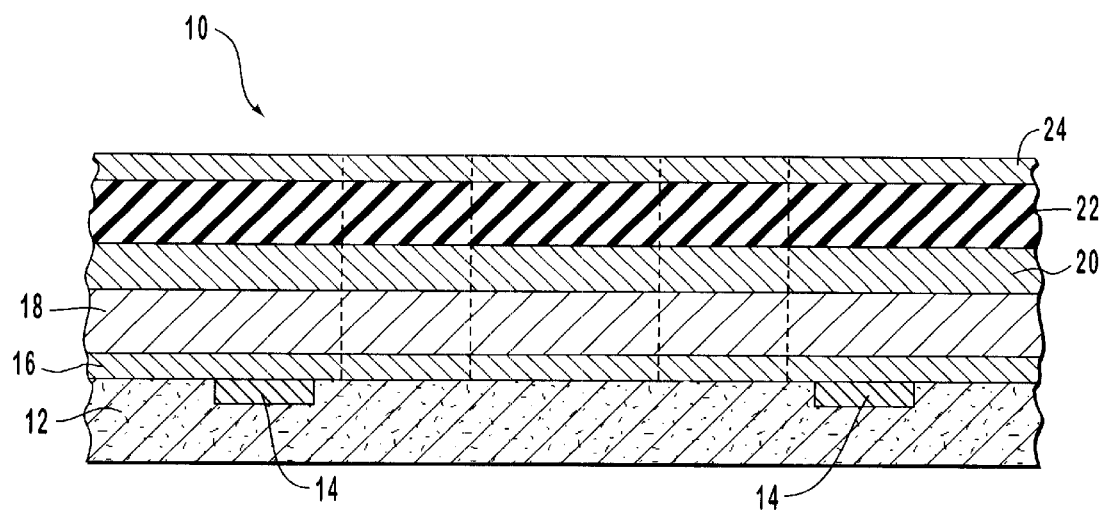
FIG. 1 is a partial cross-sectional elevation view of a silicon base layer with an active area therein, and having thereon an oxide layer, a polysilicon gate layer, a refractory metal silicide layer, and a TEOS layer. A photoresist layer overlays the other layers and a first selected pattern is defined therein as illustrated in phantom.

FIG. 1 illustrates a beginning structure for one application of the inventive process on a semiconductor substrate 10 having a silicon base layer 12. Overlying silicon base layer 12 is oxide layer 16. Oxide layer 16 may be relatively thin in comparison with the other layers depicted in FIG. 1. A polysilicon gate layer 18 is shown on oxide layer 16. Overlying polysilicon gate layer 18 is refractory metal silicide layer 20. Refractory metal silicide layer 20 may comprise any refractory metal including but not limited to titanium, tungsten, tantalum, and molybdenum. Preferably, refractory metal silicide layer 20 is substantially composed of tungsten silicide ($WSi_x$). Overlying refractory metal silicide layer 20 is a TEOS layer 22.

Figure 2:
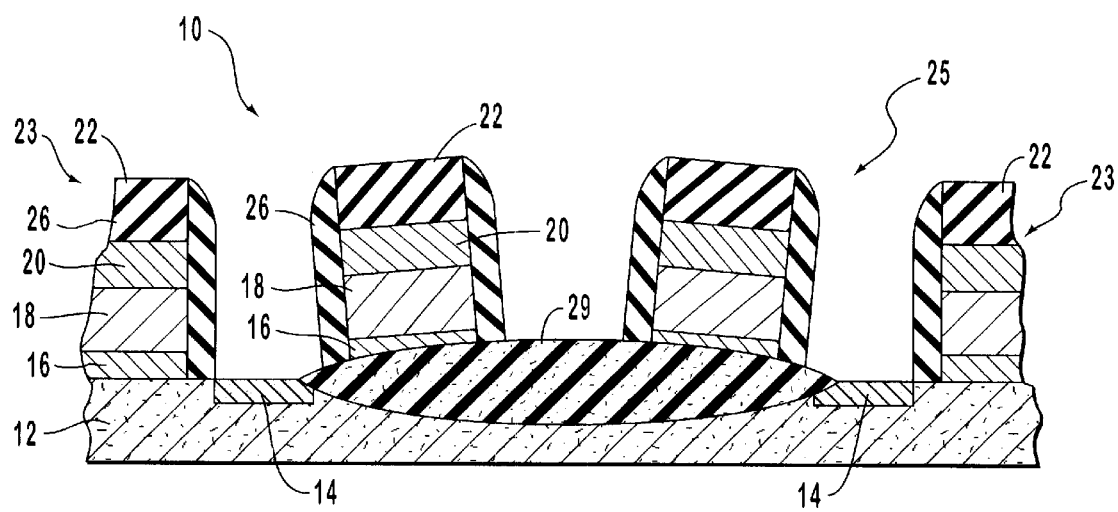
FIG. 2 is a partial cross-sectional view of the structure seen in FIG. 1 having gate stacks formed upon a field oxide region within the silicon base layer with adjacent gate stacks formed upon the silicon base layer.

A photoresist layer 24 is processed to expose a preselected pattern. A field oxide region 29 is formed, such as by local oxidation of silicon. Materials are selectively removed so as to form gate stacks 25 upon field oxide region 29 as shown in FIG. 2. Although two complete gate stacks 25 are illustrated, there can be any number of gate stacks 25 or other topographical structures formed upon field oxide region 29.

Each gate stack 25 has a spacer 26 thereon. In one embodiment, spacers 26 are formed by subjecting a layer of silicon nitride deposited over gate stacks 25 as shown in FIG. 2 to a spacer etch. Silicon nitride spacers 26 are generally perpendicular to silicon base layer 12. Alternatively, spacers 26 can be substantially composed of undoped silicon dioxide. An active area 14 is defined adjacent to each gate stack 25. Silicon base layer 12 has doped areas 14 that form active areas. Silicon base layer 12 may be doped using conventional methods such as ionic implanting or diffusion. Gate stacks 25 have an adjacent gate stack 23 on each remote side thereof.

Figure 3:
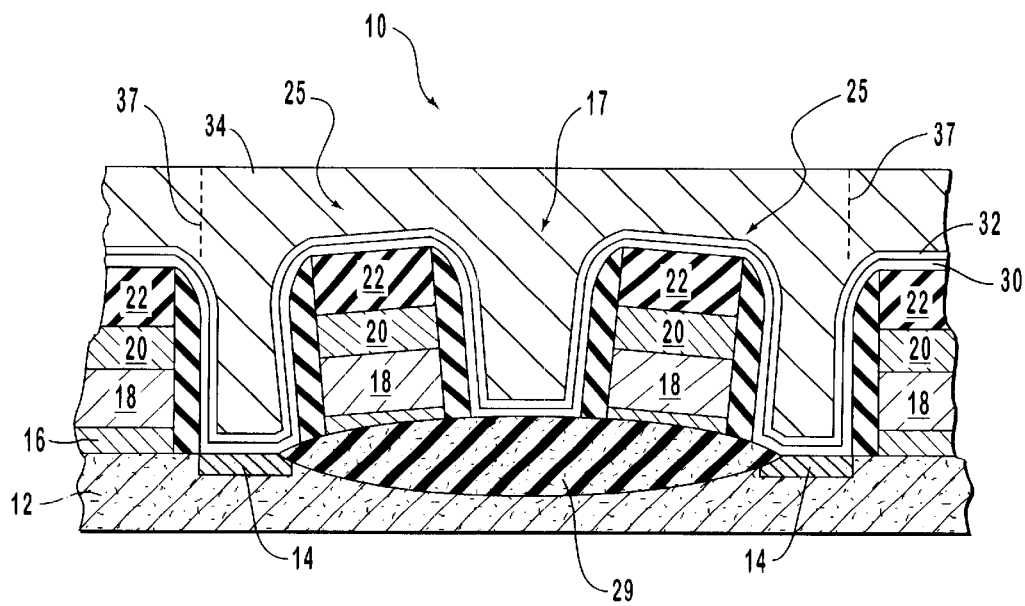
FIG. 3 is a partial cross-sectional elevation view of the structure of FIG. 2 having a first barrier layer, a hard mask layer, and a photoresist layer formed. A selected pattern for material removal is defined as illustrated in phantom.

Application of the inventive process to semiconductor structure 10 illustrated in FIG. 3 involves a first barrier layer 30 being formed over gate contacts 25. First barrier layer 30 is preferably substantially composed of titanium nitride (TiN) and is formed using a conventional process such as sputtering a TiN target or sputtering a titanium target and then heating the semiconductor substrate in a gaseous nitrogen environment to form titanium nitride.

The resultant titanium nitride layer will typically have poor step coverage due to the sputtering, and as such it will be thinner on vertically oriented surfaces of the gate stacks and be thicker on the horizontal surfaces. Step coverage is defined as the thickness of a layer on a horizontal surface as compared to the minimum thickness on a vertical surface. A preferred step coverage is a ratio of horizontal thickness to minimum vertical thickness of about one-to-one. Good step coverage is defined herein as horizontal thickness to minimum vertical thickness of about one to 0.5 or [1/0.5], greater than which is defined herein as poor step coverage.

A hard mask layer 32 is then formed over first barrier layer 30. Hard mask layer 32 is used to assist in selectively removing material when a etching process cannot be performed with sufficient control. Hard mask layer 32 is preferably formed using chemical vapor deposition (CVD) and substantially comprises material selected from the group comprising tungsten silicide, titanium-tungsten, titanium-tungsten nitride or boron nitride. The preferred hard mask layer 32 comprises CVD tungsten silicide ($WSi_x$). One of the advantages of using tungsten silicide as hard mask layer 32 in combination with sputtered titanium nitride first barrier layer 30 is that titanium nitride is one of the, surfaces which tungsten silicide readily attaches, sticks, or bonds. This overcomes one of the usual drawbacks of using tungsten silicide caused by the fact that tungsten silicide does not adhere well to other materials. In addition, CVD tungsten silicide hard mask layer 32 allows better electrical continuity where the sputtered titanium nitride of barrier layer 30 is thin so as to have poor step coverage. Additionally, hard mask layer 32 has low sheet resistivity. Low sheet resistivity is defined herein as a resistivity in a range from about 100 ahm/sq to about 150 ohm/sq.

As shown in FIG. 3, a photoresist layer 34 is then formed over hard mask layer 32. Photoresist layer 34 is patterned. Hard mask layer 32 is then etched to expose first barrier layer 30 on each side of gate stacks 25. Photoresist layer 34 is removed from semiconductor structure 10 on each side of gate stacks 23, thereby exposing hard mask layer 32 over gate stacks 23. Phantom lines 37 in FIG. 3 show what portions of photoresist layer 34 and hard mask layer 32 are to be removed. The preferred chemical etch process for hard mask layer 32 is a dry etch. The dry etch is selective to first barrier layer 30 and only removes the exposed tungsten silicide of hard mask layer 32 over gate stacks 23. First barrier layer 30 is substantially not etched by the dry etch.

Figure 4:
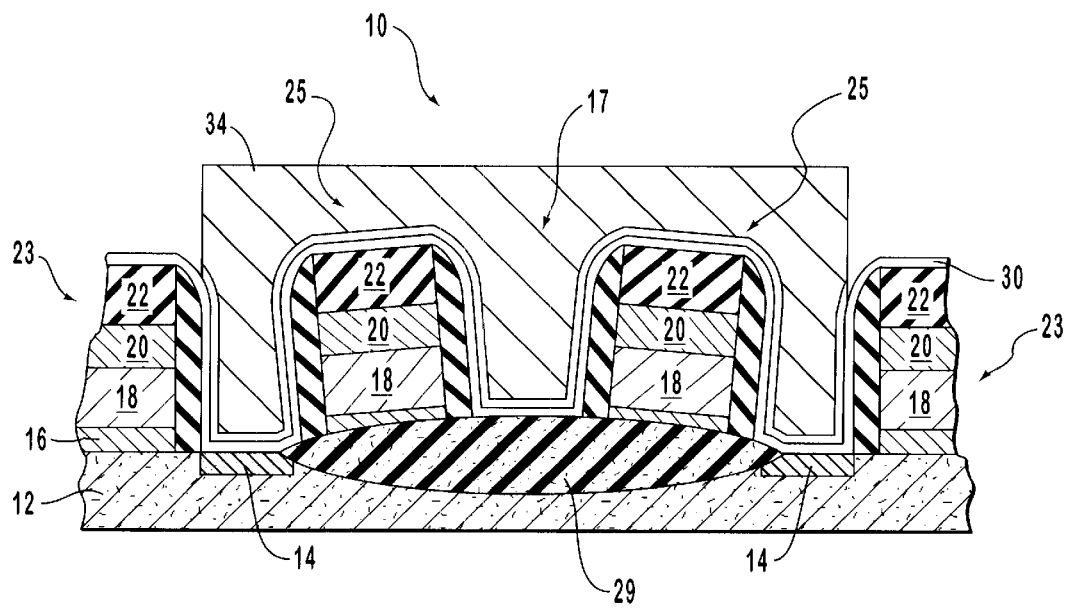
FIG. 4 is a partial cross-sectional elevation view of the structure of FIG. 3 after selectively removing portions of the photoresist layer above the adjacent gate stacks upon the silicon base layer, and after selectively removing portions of the hard mask layer overlying the adjacent gate stacks upon the silicon base layer.

At this point, as illustrated in FIG. 4, first barrier layer 30, hard mask 32, and photoresist layer 34 overlay gate stacks 25, but only first barrier layer 30 is over adjacent gate stacks 23. First barrier layer 30 and hard mask layer 32 also cover active area 14. The remainder of photoresist layer 34 is then stripped off semiconductor structure 10 using conventional processes.

The process flow selectively removes the titanium nitride of first barrier layer 30 over adjacent gate stacks 23. In this case, the preferred chemical etch is a wet etch that is selective to hard mask layer 32 comprising tungsten silicide and substantially removes only first barrier layer 30 comprising titanium nitride. Hard mask layer 32 protects first barrier layer 30 and gate stacks 25.

Figure 5:
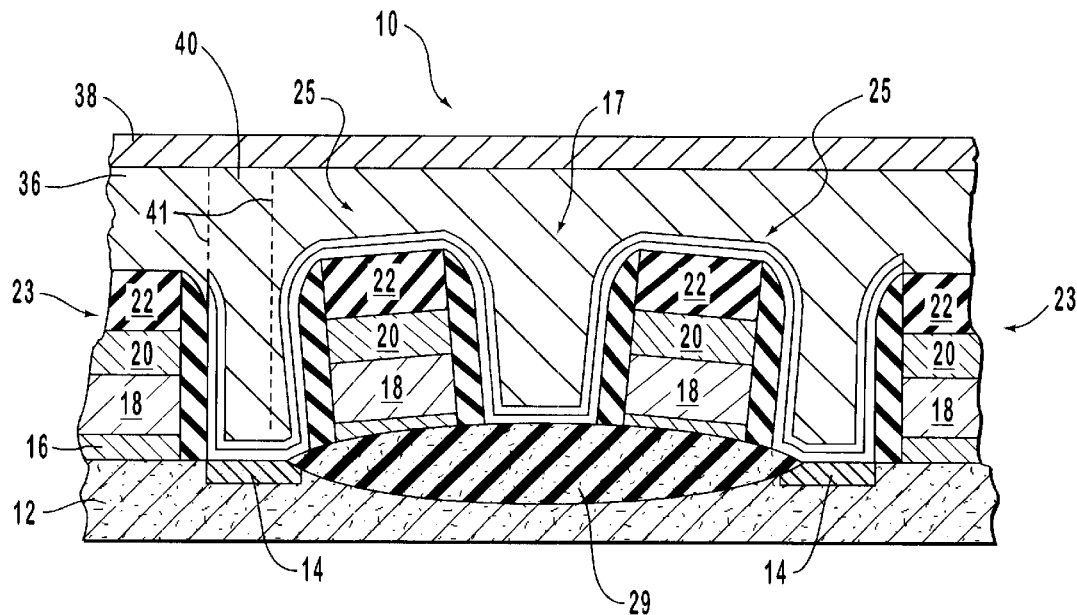
FIG. 5 is a partial cross-sectional elevation view of the structure of FIG. 4, after selectively removing the first barrier layer so as to expose a surface on the adjacent gate stacks upon the silicon base layer, and after a silica layer has been deposited over the structure, the silica having been shown in FIG. 5 as having a pattern for contact holes as is illustrated in phantom.

As illustrated in FIG. 5, a silica layer 36 is then formed over hard mask layer 32 as a passivation layer. Silica layer 36 is substantially composed of materials selected from a group consisting of silicon dioxide ($SiO_2$), borophosphosilicate glass (BPSG), borosilicate glass (BSG), and phosphosilicate glass (PSG) doped oxide, and undoped oxide. A photoresist layer 38 is then formed over silica layer 36. Photoresist layer 38 is patterned. A recess 40 is etched in silica layer 36 in a predetermined pattern illustrated in FIG. 5 by phantom lines 41. A recess 40, such as a contact hole, is formed in silica layer 36 adjacent to gate stacks 25 and generally aligned with active areas 14. As defined herein, generally aligned with the active area is intended to mean positioned substantially perpendicularly oriented to a location where the active area is situated within the semiconductor substrate. Multiple recesses 40 can be formed in silica layer 36. The etch used to form recess 40 can be anisotropic or isotropic. As long as hard mask layer 32 is substantially composed of tungsten silicide, the composition of silica layer 36 will not affect the etch that forms recess 40. The etch will preferably be selective to tungsten silicide. A typical etchant comprises $CHF_3$, $CHF_4$, or a combination thereof. The etchant has a selectivity of silica to tungsten silicide of about 12 to 1, such that the material removal rate of silica is twelve times that of tungsten silicide.

Figure 6:
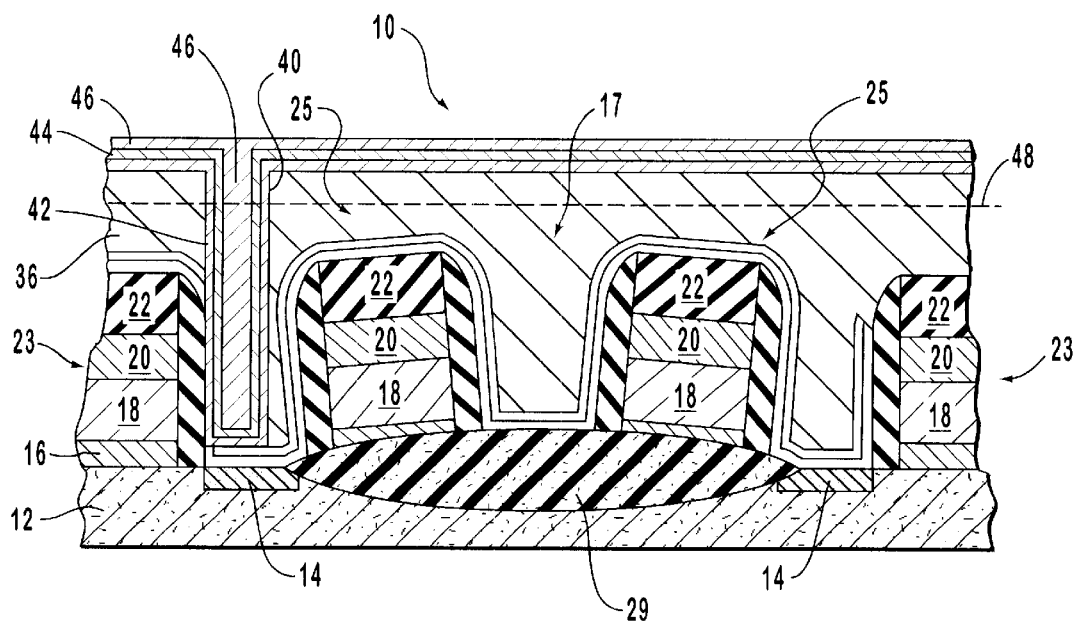
FIG. 6 is a partial cross-sectional elevation view of the multilayer structure of FIG. 5 after an etch to form the contact holes that are then filled with a diffusion barrier layer, a second barrier layer, and an electrically conductive layer, where a line seen in phantom indicates a planarizing operation to isolate filled contact holes one from another.

The next step in the novel process is to fill recess 40 in silica layer 36 thereby forming an electrical contact to hard mask layer 32. By way of example, a conventional contact plug formation method may be used. As shown in FIG. 6, first diffusion barrier layer 42 is deposited within recess 40 over hard mask layer 32. Diffusion barrier layer 42 preferably functions as an adhesion layer for materials formed thereon, and will also act as a diffusion barrier to prevent the diffusion of material therethrough. First diffusion barrier layer 42 will preferably be a substantially continuous coating of material within recess 40 and over silica layer 36, and will preferably be substantially composed of refractory metals or a nitride thereof, such as titanium, tungsten, tantalum, titanium nitride, tungsten nitride, or tantalum nitride. Most preferably, first diffusion barrier layer 42 is substantially composed of titanium.

The next step, which may be optional defending upon materials selected, is to heat treat semiconductor structure 10 so as to thermally process first diffusion barrier layer 42. Where first diffusion barrier layer 42 is substantially composed of titanium, the interface thereof with the tungsten silicide of hard mask layer 32 will create a desirable contact resistance and improve the electrical contact of the contact plug within recess 40 to hard mask layer 32. The heating of semiconductor structure 10 will preferably be in a nitrogen environment at a selected temperature at which nitrides are formed on exposed surface of first diffusion barrier layer 42.

A second barrier layer 44 is then formed over first diffusion barrier layer 42. Second barrier layer 44 will preferably be a substantially continuous coating of material with recess 40 and over first diffusion barrier layer 42, and will preferably be substantially composed of refractory metals or a nitride thereof, such as titanium, tungsten, tantalum, titanium nitride, tungsten nitride, or tantalum nitride. Most preferably, second barrier layer 44 is substantially composed of titanium nitride.

As with the first diffuser barrier layer 42, the next step, which may be optional depending on the materials selected, is to treat semiconductors substrate 10 so as to thermally process second barrier layer 44.

The formation of an electrically conductive layer 46 is the next step to fill recess 40 While electrically conductive layer 46 will preferably be composed of typical metalization conductor materials, the composition of electrically conductive layer 46 may depend on the aspect ratio of recess 40 that is formed within silica layer 36. In one embodiment, electrically conductive layer 46 is substantially composed of tungsten which is formed utilizing conventional recess filling processes so as to substantially fill recess 40. Electrically conductive layer 46 may also comprise other conductive materials such as aluminum or copper.

Once electrically conductive layer 46 substantially fills recess 40, a preferable step is the selective removal of materials from semiconductor structure 10 by a height reduction, planarizing, or abrasive process, such as chemical mechanical planarizing (CMP). In the planarizing process, any material from electrically conductive layer 46, first diffusion barrier layer 42, and second barrier layer 44 above silica layer 36 will be removed to form a first planarization surface 48 shown in FIG. 6. After the planarization process, electrically conductive layer 46, first diffuser barrier layer 42, second barrier layer 44, and silica layer 36 having top surfaces that are co-planar with first planarization surface 48. The planarizing process isolates electrically conductive layer 46 above each active area 14.

At this point in the processing, semiconductor structure 10 may undergo conventional processing depending on the specific needs, such as further processing to form a memory device, for example a dynamic access memory cell.

Figure 7:
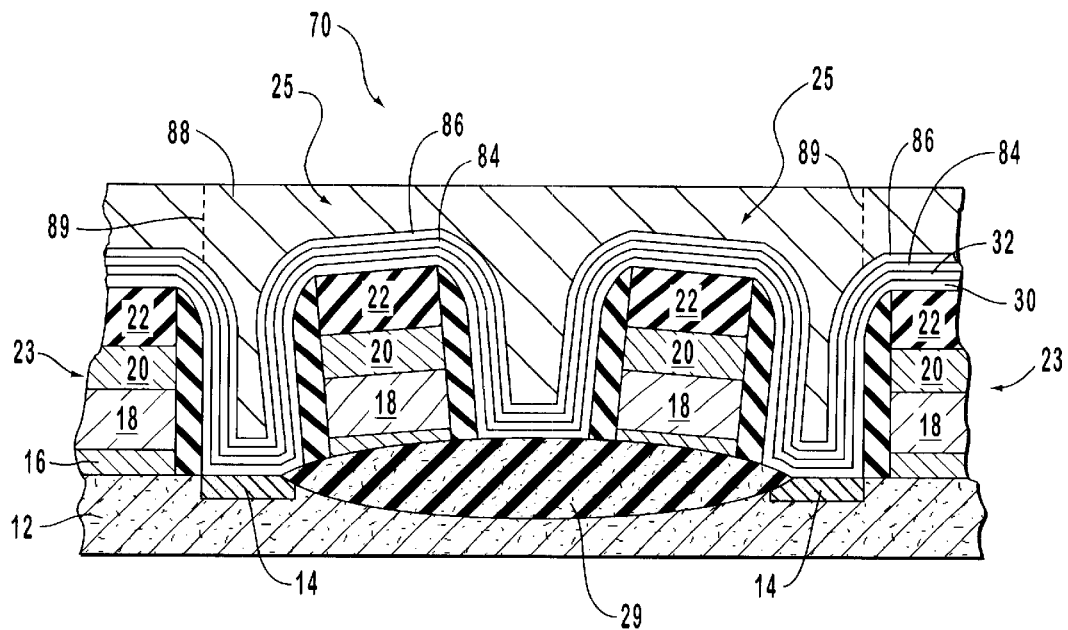
FIG. 7 is a partial cross-sectional elevation view of a beginning structure for a second embodiment of an inventive method. The structure includes gate stacks similar to those illustrated in FIGS. 1 and 2 and includes a first barrier layer, a first electrically conductive layer, a second barrier layer, a hard mask layer, and a photoresist layer formed. thereover. A first selected pattern is defined in phantom through photoresist layer and hard mask layer.

The second inventive process is illustrated by example herein with a semiconductor structure 70 having thereon gate stacks 25 seen in FIG. 7. Semiconductor structure 70 and gate stacks 25 undergo similar processing in the formation thereof as previously discussed relative to FIGS. 1 and 2. The majority of the features previously discussed apply to this embodiment of semiconductor substrate 70. The features that are not affected are identified with the same reference numbers as used in FIGS. 1–6. Only those features that have changed will be described in detail.

Upon completing the processing to create multilayer structure 72 with gate stacks 25, like those illustrated in FIG. 2, semiconductor structure 70 comprises at least two gate stacks 25 upon field oxide region 29 each having a spacer 26 with adjacent active areas 14 and adjacent gate stacks 23.

Once gate stacks 25 have been formed, first barrier layer 30 is then formed thereover. First barrier layer 30 comprises titanium nitride (TiN). First barrier layer 30 is formed using the conventional sputtering process as was previously discussed.

As illustrated in FIG. 7, a first electrically conductive layer 32 is then formed over first barrier layer 30. First electrically conductive layer 32 substantially comprises material selected from the group consisting of tungsten, tungsten silicide, titanium nitride, titanium-tungsten, titanium-tungsten nitride, and boron nitride. First electrically conductive layer 32 preferably comprises tungsten (W), and is formed using CVD processes. The advantage of CVD tungsten as first electrically conductive layer 32 is that it is highly conductive with good step coverage. Tungsten is more conformal than other electrically conductive materials and has low resistivity. The resistivity of tungsten is lower than that of tungsten nitride.

A second barrier layer 84 is then formed over first electrically conductive layer 32. Second barrier layer 84 comprises titanium nitride. Second barrier layer 84 is desirable because the CVD tungsten of first electrically conductive layer 32 is a poor barrier material. The combination of the sputtered titanium nitride of first and second barrier layers 30, 84 and the CVD tungsten of first electrically conductive layer 32 forms a preferable local interconnect structure. In the inventive process, first electrically conductive layer 32 is protected on each side by a good barrier material in the form of first barrier layer 30 and second barrier layer 84 each comprising titanium nitride.

As shown in FIG. 7, a hard mask layer 86 is then formed. Hard mask layer 86 comprises a conventional hard mask material such as polysilicon, silicon dioxide, oxide, or TEOS. Hard mask layer 86 can also be comprised substantially of tungsten silicide. If hard mask layer 86 is composed substantially of tungsten silicide, gate stacks 25 will under go the same processing as discussed in the previous application of the inventive process relative to semiconductor structure 10. Preferably, hard mask layer 86 comprises either silicon dioxide or polysilicon.

A photoresist layer 88 is then formed over hard mask layer 86. Photoresist layer 88 is patterned so as to selectively expose hard mask layer 86 over adjacent gate stacks 23 on each side of gate stacks 25. Phantom lines 89 in FIG. 7 show what portions of photoresist layer 88 will be selectively removed over adjacent gate stacks 23, thereby exposing hard mask layer 86.

Figure 8:
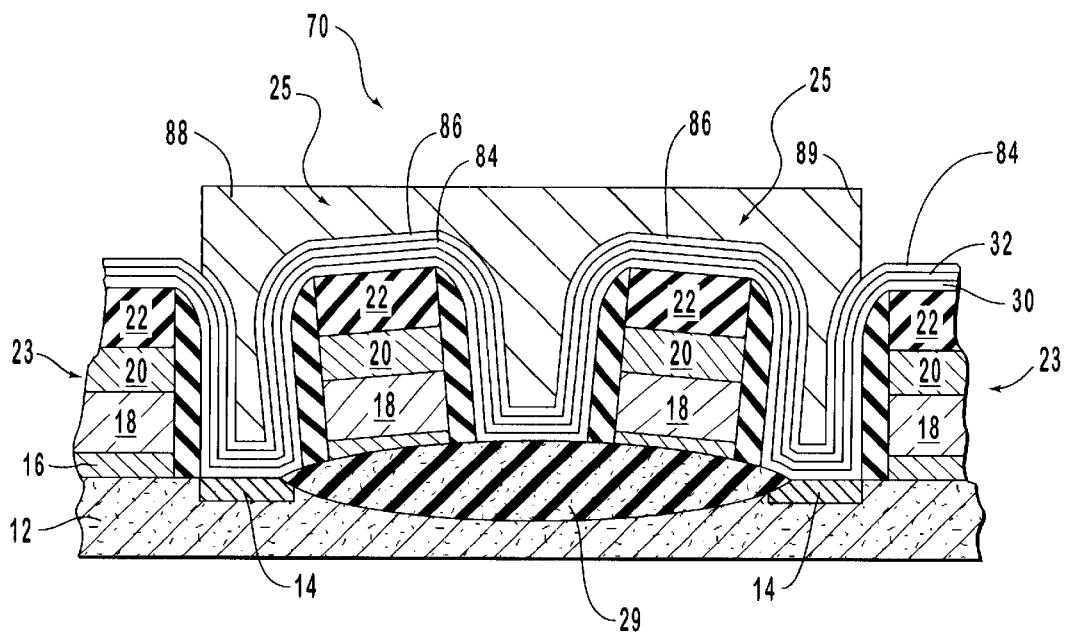
FIG. 8 is a partial cross-sectional elevation view of the structure of FIG. 7 after patterning and etching through the photoresist layer so as to selectively remove the hard mask layer over the two extreme gate stacks.

Semiconductor structure 70 is then etched to remove exposed portions of hard mask layer 86 as shown in FIG. 7 by phantom line 89. The preferred chemical etch is a dry etch which is selective to second barrier layer 84 and removes substantially only exposed portions of hard mask layer 86. Second barrier layer 84 is substantially untouched by the chemical etch. After the etch, first barrier layer 30, first electrically conductive layer 32, and second barrier layer 84 overlay adjacent gate stacks 23 as illustrated in FIG. 8. The remainder of second photoresist layer 88 is then stripped off semiconductor structure 70 using conventional methods.

Figure 9:
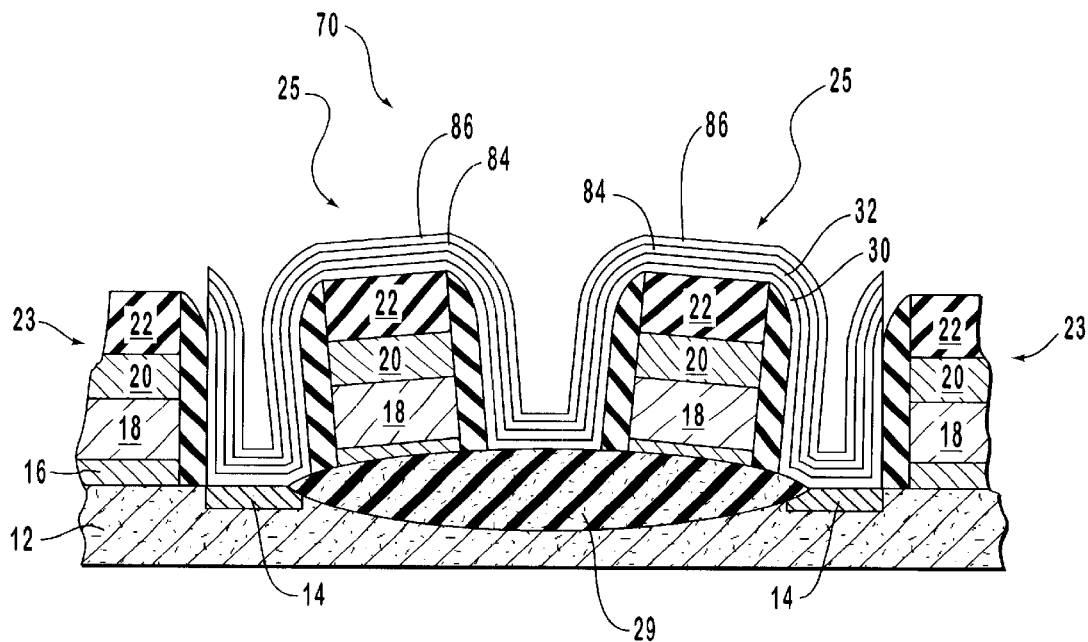
FIG. 9 is a partial cross-sectional elevation view of the multilayer structure of FIG. 8 after removing the photoresist layer and after an etch to selectively remove the first barrier layer, first electrically conductive layer, and second barrier layer so as to expose the adjacent gate stacks upon the silicon base layer.

Semiconductor structure 70 is then etched to selectively remove the exposed portions of second barrier layer 84, first electrically conductive layer 32, and first barrier layer 30 overlying adjacent gate stacks 23 as is shown in FIG. 9. The preferred etch is selective to hard mask layer 86 and removes substantially only first barrier layer 30, second barrier layer 84, and first electrically conductive layer 32.

The preferred etchant mixture to selectively remove first barrier layer 30, second barrier layer 84, and first electrically conductive layer 32 is an ammonium peroxide mixture comprising a ratio of one part ammonium hydroxide to one part hydrogen peroxide to five parts water by volume or 1:1:5 ($NH_4OH:H_2O_2:H_2O$) to remove the titanium nitride of first barrier layer 30 over adjacent gate stacks 23. The preferred etch uses the ammonium peroxide mixture in a temperature range from about 20° C. to 95° C. The most preferred temperature is about 65° C. The inventive process using an ammonium peroxide etch allows both the barrier material and the local interconnect material to a etched in the same etch solution.

The ammonium peroxide etch selectively removes second barrier layer 84, first electrically conductive layer 32, and first barrier layer 30, thereby exposing adjacent gate stacks 23 as illustrated in FIG. 9. Gate stacks 25 are left with second barrier layer 84, first electrically conductive layer 32, first barrier layer 30, and hard mask layer 86 overlying them.

Figure 10:
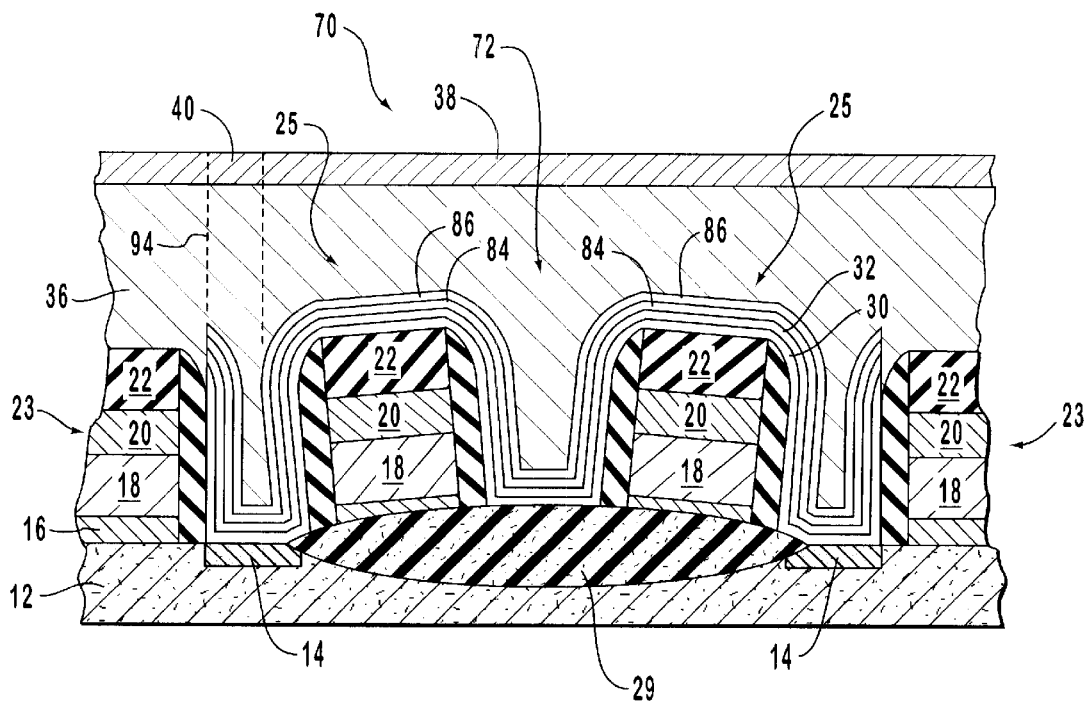
FIG. 10 is a partial cross-sectional elevation view of the multilayer structure of FIG. 9 after the deposition of a silica layer and a photoresist layer Contact holes extending through the silica layer and the hard mask layer, to the second barrier layer are shown in phantom.

As shown in FIG. 10, silica layer 36 is then formed over hard mask layer 86. Silica layer 36 is substantially composed of materials selected from a group consisting of BPSG, BSG, PSG, doped oxide, and undoped oxide. Photoresist layer 38 is then formed over silica layer 36. Photoresist layer 38 is patterned in a pattern a, to form recess 40, such as a recess, adjacent to gate stacks 25 and substantially aligned with active areas 14.

The composition of hard mask 86 determines how deep recess hole 40 is to be. The etch to form recess 40 is selective to tungsten silicide and typically comprises $CHF_3$, $CHF_4$, or a combination thereof. Therefore, where hard mask layer 86 comprises tungsten silicide the etch will stop on hard mask layer 86 as illustrated in FIG. 5 relative to the first application of the inventive process.

In the preferred embodiment that utilizes a hard mask layer 86 comprising polysilicon, silicon dioxide, or tungsten silicide. The etch forms recess 40 by etching through hard mask layer 86 to second barrier layer 84 as illustrated by phantom lines 94 in FIG. 10. In some cases, the etch may etch through to first electrically conductive layer 32 depending on the chemistry of the etchant and the difficulty in controlling the etch. Preferably the etch stops on second barrier layer 84. In cases where control of the etch is critical, the chemistry of the etchant can be such that the etch is selective to titanium nitride. This would result in a high removal rate of the silica of hard mask layer 86 but would be highly selective to second barrier layer 84 which is substantially composed of titanium nitride. Consequently, second barrier layer 84 will be substantially unremoved by the etch.

Recess 40 is then filled with an electrically conductive layer which is typically a contact plug formation process followed by a height reduction of planarizing process, such as CMP as was previously discussed relative to FIG. 6. Semiconductor structure 70 may continue normal processing as needed, such as further processing to form a memory device, for example a dynamic access memory cell.

One of the advantages of the present invention as compared to the prior art is the increased etchant selectivity of the contact etch. The present inventive process increases the yield rate because of the ability to control the etch so as to avoid compromising the active area in the semiconductor substrate by the contact etch. The increased step coverage of the interconnect structure formed by the inventive process enables semiconductor substrate 10 and 70 to be thoroughly cleaned without breaking through the tungsten silicide or tungsten, respectively, thereby losing electrical connection of the interconnect structure.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A conductive structure comprising:
    a semiconductor substrate having a topographical structure thereon, said semiconductor substrate having therein an active area adjacent to a gate stack;
    a first barrier layer composed of titanium nitride overlying said semiconductor substrate;
    a hard mask layer overlying said first barrier layer, said hard mask layer having a horizontal thickness to minimum vertical thickness of not less than about one to 0.5 and being composed of material selected from a group consisting of tungsten silicide, titanium-tungsten, titanium-tungsten nitride, and boron nitride;
    a silica layer overlying said hard mask layer, said silica layer having a recess formed therein terminating at said active area, said silica layer being composed of material selected from the group consisting of borophosphosilicate glass, borosilicate glass, phosphosilicate glass, and undoped silicon dioxide; and
    an electrically conductive material disposed in said recess, said electrically conductive material filling said recess and forming an electrical contact with said hard mask layer, said electrically conductive material comprising:
        a first diffusion barrier layer disposed within said recess;
        a second diffusion barrier layer overlaying said first diffusion barrier layer within said recess; and
        an electrically conductive layer overlaying said second diffusion barrier layer within said recess and filling said recess.

2. A conductive structure as recited in claim 1, wherein said semiconductor substrate comprises a silicon base layer having a plurality of active areas therein, and wherein a plurality of gate stack are situated thereon, and
    wherein said topographical structure is situated upon a field oxide region within the semiconductor substrate and comprises:
        an electrically conductive gate layer;
        a refractory metal silicide layer on said electrically conductive gate layer;
        an insulative layer on said refractory metal silicide layer; and
        a spacer on a lateral surface of said each of said electrically conductive gate layer, said refractory metal silicide layer, said insulative layer.

3. A conductive structure as recited in claim 2, wherein:
    said silicon base layer has a plurality of said field oxide regions therein, the conductive structure further comprising:
        a plurality of said topographical structures, each being situated upon a respective one of said field oxide regions.

4. A conductive structure as recited in claim 1, wherein the first diffusion barrier layer is composed of material selected from the group consisting of titanium, aluminum nitride, tungsten nitride, titanium nitride, and tantalum nitride.

5. A conductive structure as recited in claim 1, wherein the second diffusion barrier layer is composed of material selected from the group consisting of aluminum nitride, tungsten nitride, titanium nitride, and tantalum nitride.

6. A conductive structure as recited in claim 1, wherein the electrically conductive layer is composed of material selected from the group consisting of tungsten, aluminum, and copper.

7. A conductive structure as recited in claim 1, wherein said hard mask layer is composed of tungsten silicide.

8. A conductive structure making contact with a semiconductor substrate having a topographical structure upon a field oxide region within the semiconductor substrate, said semiconductor substrate having therein an active area adjacent to a gate stack upon said semiconductor substrate, said conductive structure comprising:
   a first barrier layer upon said semiconductor substrate;
   a first electrically conductive layer overlaying said first barrier layer, said first electrically conductive layer having a horizontal thickness to minimum vertical thickness of not less than about one to 0.5, wherein said first electrically conductive layer is composed of a material selected from a group consisting of tungsten, tungsten silicide, titanium nitride, titanium-tungsten, titanium-tungsten nitride, and boron nitride;
   a second barrier layer composed of titanium nitride upon said first electrically conductive layer;
   a hard mask layer overlying said second barrier layer, said hard mask being composed of material selected from the group consisting of polysilicon, silicon dioxide, and tungsten silicide;
   a silica layer overlaying said hard mask layer, said silica layer having a recess formed therein terminating at said active area, said silica layer being composed of material selected from the group consisting of borophosphosilicate glass, borosilicate glass, phosphosilicate glass, and undoped silicon dioxide; and
   a second electrically conductive material disposed in said recess, said second electrically conductive material filling said recess, thereby forming an electrical contact to said hard mask layer, said electrically conductive material comprising:
      a first diffusion barrier layer disposed in said recess;
      a second barrier layer overlying said first diffusion barrier layer in said recess; and
      a second electrically conductive layer over said second barrier layer in said recess so as to fill said recess.

9. The conductive structure as recited in claim 8, wherein said hard mask is composed of material selected from the group consisting of polysilicon and silicon dioxide.

10. The conductive structure as recited in claim 8, wherein said first electrically conductive layer is composed of tungsten.

11. A conductive structure as recited in claim 8, wherein said second barrier layer is composed of titanium nitride.

12. The conductive structure as recited in claim 8, wherein said first barrier layer is composed of titanium nitride.

13. The conductive structure as recited in claim 8, wherein the first diffusion barrier layer is composed of material selected from the group consisting of titanium, aluminum nitride, tungsten nitride, titanium nitride, and tantalum nitride.

14. The conductive structure as recited in claim 8, wherein the second diffusion barrier layer is composed of material selected from the group consisting of aluminum nitride tungsten nitride, titanium nitride, and tantalum nitride.

15. The conductive structure as recited in claim 8, wherein the second electrically conductive layer is composed of material selected from the group consisting of tungsten, aluminum, and copper.

16. The conductive structure as recited in claim 8, wherein said semiconductor substrate is composed of a silicon base layer having therein a plurality of active areas and having thereon a plurality of gate stack, and
   wherein said topographical structure upon said field oxide region within the semiconductor substrate comprises:
      an electrically conductive gate layer;
      a refractory metal silicide layer on said electrically conductive gate layer;
      an insulative layer on said refractory metal silicide layer; and
      a spacer on a lateral surface of said each of said electrically conductive gate layer, said refractory metal silicide layer, said insulative layer.

17. The conductive structure as recited in claim 16, further comprising a plurality of said topographical structures on said silicon base layer.

18. A conductive structure comprising:
   a silicon base layer having a plurality of active areas and a field oxide region therein;
   a topographical structure upon said silicon base layer, said topographical structure being situated upon said field oxide region and including:
      an electrically conductive gate layer;
      a refractory metal silicide layer on said electrically conductive gate layer;
      an insulative layer on said refractory metal silicide layer; and
      a spacer on a lateral surface of each of
         said electrically conductive gate layer;
         said refractory metal silicide layer; and
         said insulative layer;
   a plurality of gate stacks on the silicon base layer each being adjacent to an active area of said plurality of active areas;
   a first barrier layer composed of a refractory metal nitride overlying said silicon base layer;
   a hard mask layer overlying said first barrier layer, said hard mask layer having:
      a horizontal thickness to minimum vertical thickness of not less than about one to 0.5, said hard mask layer being composed of material selected from a group consisting of tungsten silicide, titanium-tungsten, titanium-tungsten nitride, and boron nitride;
   a silica layer overlying said hard mask layer, said silica layer having a recess formed therein terminating at said active area, said silica layer being composed of material selected from the group consisting of borophosphosilicate glass, borosilicate glass, phosphosilicate glass, and undoped silicon dioxide; and
   an electrically conductive material disposed in said recess, said electrically conductive material filling said recess and being in electrical communication with said hard mask layer, said electrically conductive material comprising:
      a first diffusion barrier layer disposed within said recess;
      a second diffusion barrier layer overlaying said first diffusion barrier layer within said recess; and
      an electrically conductive layer overlaying said second diffusion barrier layer within said recess and filling said recess.

19. A conductive structure as recited in claim 18, wherein:
said silicon base layer has a plurality of said field oxide regions therein, the conductive structure further comprising:
a plurality of said topographical structures each being situated upon a respective one of said field oxide regions.

20. A conductive structure as recited in claim 18, wherein:
the first diffusion barrier layer is composed of material selected from the group consisting of titanium, aluminum nitride, tungsten nitride, titanium nitride, and tantalum nitride;
the second diffusion barrier layer is composed of material selected from the group consisting of aluminum nitride, tungsten nitride, titanium nitride, and tantalum nitride;
the electrically conductive layer is composed of material selected from the group consisting of tungsten, aluminum, and copper; and
said hard mask layer is composed of tungsten silicide.

21. A conductive structure comprising:
a semiconductor substrate having an acting e area therein;
a gate stack on the semiconductor substrate and adjacent to the active area;
a first barrier layer composed of a refractory metal nitride overlying said semiconductor substrate;
a hard mask layer overlying said first barrier layer, said hard mask layer having a horizontal thickness to minimum vertical thickness of not less than about one to 0.5 and being composed of material selected from a group consisting of tungsten silicide, titanium-tungsten, titanium-tungsten nitride, and boron nitride;
a silica layer overlying said hard mask layer, said silica layer having a recess formed therein terminating at said active area, said silica layer being composed of material selected from the group consisting of borophosphosilicate glass, borosilicate glass, phosphosilicate glass, and undoped silicon dioxide; and
an electrically conductive material disposed in said recess, said electrically conductive material filling said recess and being in electrical communication with said hard mask layer, said electrically conductive material comprising:
a first diffusion barrier layer disposed within said recess;
a second diffusion barrier layer overlaying said first diffusion barrier layer within said recess; and
an electrically conductive layer overlaying said second diffusion barrier layer within said recess and filling said recess.

* * * * *

UNITED STATES PATENT AND TRADEMARK OFFICE
CERTIFICATE OF CORRECTION

PATENT NO.    : 6,410,984 B1
DATED         : June 25, 2002
INVENTOR(S)   : Jigish D. Trivedi and Ravi Iyer It is certified that error appears in the above-identified patent and that said Letters Patent is hereby corrected as shown below:

Title page,
Item [60], Related U.S. Application Data, change "2,981,380" to -- 5,981,380 --
Item [56], References Cited, change "4,884,123" to -- 4,834,123 --

Column 1,
Line 8, after "Interconnect," delete "now U.S. Pat. No. 5,981,380,"
Lines 21 and 28, before "interconnect" change "lo,al" to -- local --
Line 43, after "metal" change "suicides" to -- silicides --

Column 2,
Line 26, before "titanium" change "it" to -- if --
Line 27, after "layers" delete the semi-colon Column 3,
Line 1, after "structure" change "using)" to -- using --
Line 29, before "removed" change ",electivity" to -- selectivity --

Column 4,
Line 30, after "formed" delete the period

Column 5,
Line 55, before "surfaces" change "the," to -- the --
Line 65, before "to about" change "ahm/sq" to -- ohm/sq --

Column 6,
Line 66, after "optional" change "defending" to -- depending --

Column 7,
Line 25, after "recess 40" insert a period

UNITED STATES PATENT AND TRADEMARK OFFICE
CERTIFICATE OF CORRECTION

PATENT NO.     : 6,410,984 B1
DATED          : June 25, 2002
INVENTOR(S)    : Jigish D. Trivedi and Ravi Iyer It is certified that error appears in the above-identified patent and that said Letters Patent is hereby corrected as shown below:

Column 9,
Line 12, before "etched" change "a" to -- be --
Line 25, after "pattern" change "a," to -- as --
Line 30, after "$CHF_3$," change "$CHF_4$.," to -- $CHF_4$, --

Column 13,
Line 22, before "area" change "acting e" to -- active --

Signed and Sealed this

Eighteenth Day of February, 2003

JAMES E. ROGAN
*Director of the United States Patent and Trademark Office*